(12) United States Patent
Zhang et al.

(10) Patent No.: US 10,348,290 B1
(45) Date of Patent: Jul. 9, 2019

(54) SYSTEM AND METHOD FOR TRANSMITTER

(71) Applicant: Xilinx, Inc., San Jose, CA (US)

(72) Inventors: Hongtao Zhang, San Jose, CA (US); Yohan Frans, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 127 days.

(21) Appl. No.: 15/472,080

(22) Filed: Mar. 28, 2017

(51) Int. Cl.
*H04B 1/04* (2006.01)
*H03K 17/14* (2006.01)
*H03K 19/177* (2006.01)

(52) U.S. Cl.
CPC ....... *H03K 17/14* (2013.01); *H03K 19/17744* (2013.01); *H04B 1/04* (2013.01)

(58) Field of Classification Search
CPC ....... H03K 19/017509; H03K 19/0005; H03K 19/0013; H03K 19/018521; H03K 19/17744; H03K 17/14; H03K 17/162; H04B 1/04
USPC ................................. 327/108–112
See application file for complete search history.

(56) References Cited

U.S. PATENT DOCUMENTS

| | | | |
|---|---|---|---|
| 5,465,076 A * | 11/1995 | Yamauchi | H03K 3/0315 327/277 |
| 7,106,099 B1 | 9/2006 | Nix | |
| 7,426,235 B1 | 9/2008 | Anderson et al. | |
| 7,480,347 B2 | 1/2009 | Black et al. | |
| 7,599,431 B1 | 10/2009 | Anderson et al. | |
| 7,668,238 B1 | 2/2010 | Rokhsaz | |
| 7,830,985 B2 | 11/2010 | Black et al. | |
| 8,396,110 B1 | 3/2013 | Hsieh | |
| 8,442,105 B1 | 5/2013 | Dick et al. | |
| 8,472,515 B1 | 6/2013 | Savoj | |
| 9,025,691 B1 | 5/2015 | Wu et al. | |
| 9,325,489 B2 | 4/2016 | Hsieh et al. | |
| 9,461,851 B1 | 10/2016 | Liao et al. | |
| 9,712,046 B2 * | 7/2017 | Sandner | H02M 1/38 |
| 2007/0133719 A1 * | 6/2007 | Agazzi | H03M 1/0626 375/341 |
| 2016/0218713 A1 * | 7/2016 | Oh | H03K 19/0013 |

* cited by examiner

*Primary Examiner* — Lincoln D Donovan
*Assistant Examiner* — Diana J. Cheng
(74) *Attorney, Agent, or Firm* — David O'Brien; Craige Thompson

(57) ABSTRACT

A transmitter includes a predriver circuit configured to perform a first equalization process to compensate jitter caused by the predriver circuit. The predriver circuit includes a first path having a first driving strength and configured to generate a first path output signal by applying a first delay to a predriver input signal. The predriver circuit includes a second path having a second driving strength less than the first driving strength and configured to generate a second path output signal by applying a second delay to the predriver input signal. A summing node is configured to combine the first path output signal and the second path output signal to provide a summing node output signal. A driver circuit coupled to the predriver circuit is configured to generate a driver output signal based on the summing node output signal and drive the driver output signal to a receiver through a channel.

20 Claims, 11 Drawing Sheets

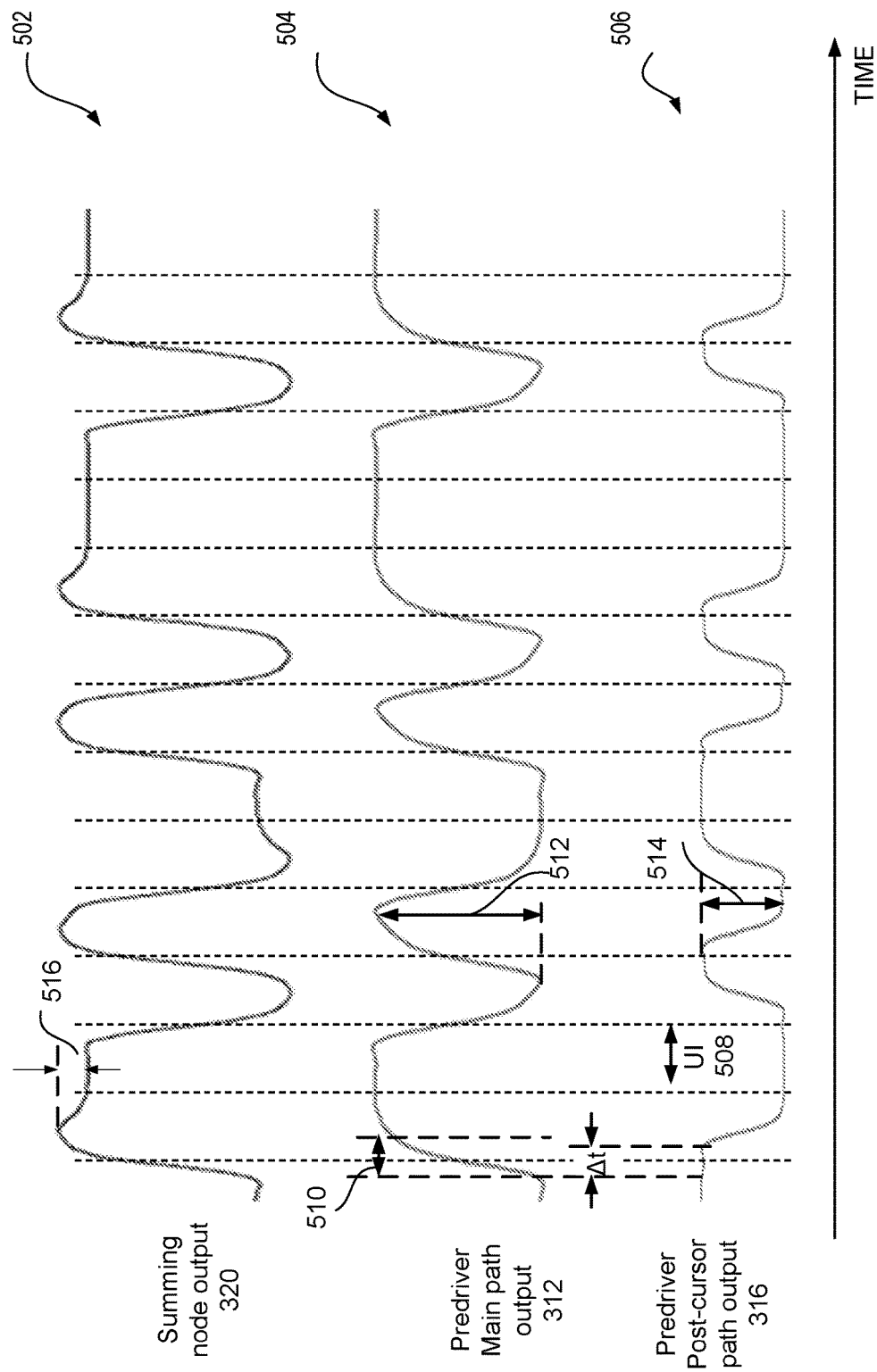

SYSTEM AND METHOD FOR TRANSMITTER

TECHNICAL FIELD

Examples of the present disclosure generally relate to integrated circuits (ICs) and, in particular, to an embodiment related to a serial link communication system.

BACKGROUND

High-speed communication links using serial interface protocols are used to communicate data between devices. The data rate requirements of such serial data links continue to increase as technology advances. In addition, larger numbers of transceivers may be needed in applications due to increases in bandwidth and throughput requirements. To accommodate the increase of the data rate and the number of transceivers, high-performance high-speed serial links with optimized power efficiency are desired.

Accordingly, it would be desirable and useful to provide an improved serial link system.

SUMMARY

In some embodiments in accordance with the present disclosure, a transmitter includes a predriver circuit and a driver circuit. The predriver circuit is configured to perform a first equalization process based on properties of the predriver circuit to reduce jitter caused by the predriver circuit. The predriver circuit includes a first path configured to generate a first path output signal by applying a first delay to a predriver input signal, the first path having a first driving strength; a second path configured to generate a second path output signal by applying a second delay to the predriver input signal, the second path having a second driving strength less than the first driving strength; and a first summing node configured to combine the first path output signal and the second path output signal to provide a summing node output signal. The driver circuit is coupled to the predriver circuit and configured to generate a driver output signal based on the summing node output signal and drive the driver output signal to a receiver through a channel.

In some embodiments, the driver circuit is configured to perform a second equalization process based on conditions of the channel to reduce jitter caused by the channel.

In some embodiments, the driver circuit includes a finite impulse response (FIR) filter configured to perform the second equalization process.

In some embodiments, the first path output signal has a first polarity opposite to a second polarity of the second path output signal.

In some embodiments, the first path includes a first tapered buffer chain including a first number of inverters connected in series, and the second path includes a second tapered buffer chain including a second number of inverters connected in series.

In some embodiments, the first number has a first parity different from a second parity of the second number.

In some embodiments, the first number is less than the second number.

In some embodiments, a difference between the first delay and the second delay is less than a unit interval (UI) of the predriver input signal and greater than a rise time of the predriver input signal.

In some embodiments, the predriver circuit includes a buffer circuit coupled to the first summing node and configured to generate a buffered summing node output signal based on the summing node output signal. The driver circuit is configured to receive the buffered summing node output signal and generate the driver output signal based on the buffered summing node output signal.

In some embodiments, the buffer circuit includes a limiting amplifier configured to generate the buffered summing node output signal, wherein the buffered summing node output signal has a rail-to-rail amplitude swing.

In some embodiments in accordance with the present disclosure, a method includes performing, by a predriver circuit, a first equalization process based on properties of the driver circuit to reduce jitter caused by the predriver circuit; generating, by a driver circuit coupled to the predriver circuit, a driver output signal based on the summing node output signal; and driving, by the driver circuit, the driver output signal to a receiver through a channel. The first equalization process includes generating a first path output signal by applying a first delay to a predriver input signal, the first path output signal having a first amplitude; generating a second path output signal by applying a second delay to the predriver input signal, the second path output signal having a second amplitude less than the first amplitude; and combining the first path output signal and the second path output signal to provide a summing node output signal.

In some embodiments, the method includes performing, by the driver circuit, a second equalization process based on conditions of the channel to reduce jitter caused by the channel.

In some embodiments, the method includes performing the second equalization process using a finite impulse response (FIR) filter.

In some embodiments, the method includes generating the first path output signal using a first path, the first path including a first tapered buffer chain including a first number of inverters connected in series; and generating the second path output signal using a second path, the second path including a second tapered buffer chain including a second number of inverters connected in series.

In some embodiments, the method includes generating, using a buffer circuit included in the predriver circuit, a buffered summing node output signal based on the summing node output signal; and generating, by the driver circuit, the driver output signal based on the buffered summing node output signal.

In some embodiments, the method includes generating, using a limiting amplifier included in the buffer circuit, the buffered summing node output signal, wherein the buffered summing node output signal has a rail-to-rail amplitude swing.

Other aspects and features will be evident from reading the following detailed description and accompanying drawings.

BRIEF DESCRIPTION OF THE DRAWINGS

FIG. 5 is a timing diagram illustrating exemplary waveforms of signals of a predriver according to some embodiments of the present disclosure.

DETAILED DESCRIPTION

Figure 1:
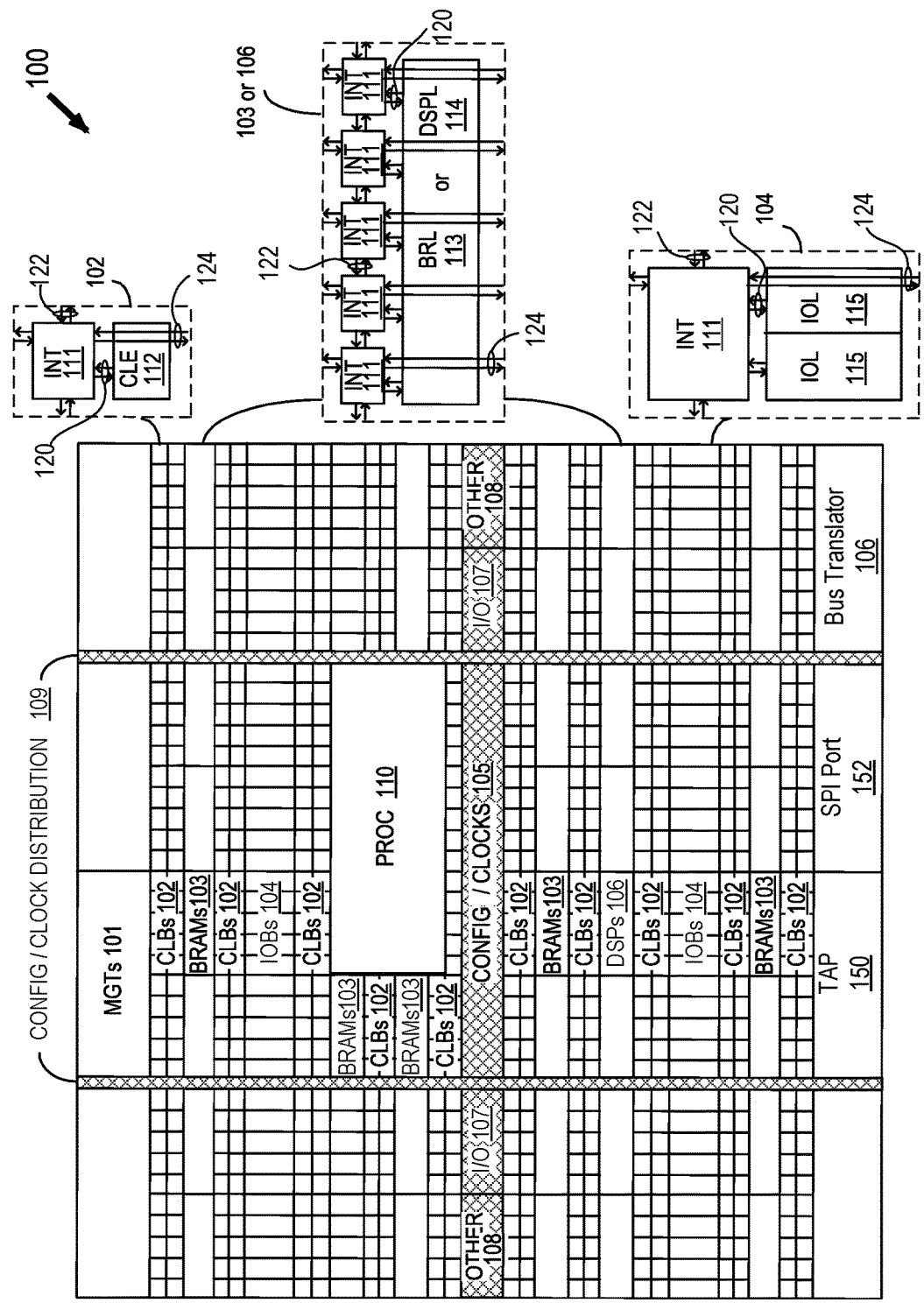
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. For high-speed serial link communication (e.g., with a data rate greater than 25 Gbps), the data rate is often limited by channel loss, crosstalk, reflections and various circuit impairments such as nonlinearity and limited bandwidth. The total jitter presented at the receiver slicers may be used to measure the performance of the serial link. The sources of the total jitter include various components of the serial link including, for example, the transmitter, the channel, and the receiver. The total jitter may include random jitter and deterministic jitter. The random jitter may result from noise sources such as flicker and thermal noise in the circuits. The deterministic jitter may include duty-cycle distortion, inter-symbol interference (ISI), periodic jitter, power supply induced jitter, bounded uncorrelated jitter, resulting from various jitter sources including, for example, electromagnetic interference, crosstalk, reflections, power supply, and bandwidth limitation. The duty-cycle distortion and ISI are also referred to as data dependent jitter. The random jitter, periodic jitter, power supply induced jitter, and bounded uncorrelated jitter may also be referred to as data independent jitter.

In low power transmitter designs, a low power transmitter may include a power-optimized serializer (e.g., a minimum size serializer) having a limited driving strength and a load-limited output driver providing the power to drive large loads (e.g., various on-chip and off-chip load circuits and the transmission line of the channel). A predriver (e.g., a predriver including a tapered buffer chain) may be inserted between the serializer and the output driver, which buffers the output signal of the serializer and provide enough drive strength to drive the output driver. However, the predriver may be power costly and induce jitter including ISI. Such predriver induced jitter may be passed to the output of the output driver, amplified by the channel, and received by the receiver. The predriver induced jitter may be nonlinear, and may not be reduced or removed by various equalization techniques (e.g., continuous time linear equalization (CTLE), decision feedback equalization (DFE)) in the receiver. For integrated circuit (IC) solutions, it has been discovered that predriver equalization methods may be exploited to reduce the predriver induced jitter at the output of the predriver, thereby reducing jitter at the output of the transmitter. Such predriver equalization provides power and area savings and achieves robust performance across the fabrication process, voltage, and temperature (PVT) of the fabrication process and various data rates.

With the above general understanding borne in mind, various embodiments for predriver equalization are generally described below. Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An 10B 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the predriver equalization is not limited to the exemplary IC depicted in FIG. 1, and that IC having other configurations, or other types of IC, may also implement the predriver equalization.

As discussed above, in some embodiments, an output driver of a transmitter need to drive the transmission line of the channel (e.g., with a resistance equal to or greater than 50 ohms) and other load circuits (e.g., heavily-loaded electrostatic discharge (ESD) protection circuits). A predriver including a tapered buffer chain may be inserted between the serializer and the output driver to drive the output driver. In some embodiments, at very high speeds (e.g., data rate >40 Gbps for 16 nm technology), the predriver may require that each stage of the tapered buffer chain has a lower fan-out ratio (e.g., 1.2 or less) to limit ISI in the predriver output signal. In such embodiments, the tapered buffer chain may use a higher number of stages (e.g., equal to or greater than ten) in the tapered buffer chain to achieve a predetermined driving strength. Such a tapered buffer chain using a higher number of stages may be power costly and require careful control of power supply induced jitter (PSIJ). In some embodiments, stages having a higher fan out ratio (e.g., between about 1.5 to 2) may be used. In those embodiments, the tapered buffer chain may use a lower number of stages (e.g., between 3 and 5). However, such reduction of the stage number comes at the cost of increased ISI at the predriver output. Further, this type of predriver induced ISI is non-linear and may not be able to be reduced or removed out by equalization at the receiver.

Described below are methods and systems that perform a predriver equalization process to reduce the predriver induced jitter. As described in detail below, the predriver equalization process equalizes the transition edge of the predriver output signal by de-emphasis, thereby reducing the predriver induced jitter (e.g., ISO. In some embodiments, the predriver equalization process does not pre-compensate for the channel loss. As such, the configuration and effect of the predriver equalization do not depend on the channel conditions. In some embodiments, the predriver equalization process may not equalize the amplitude of the predriver output signal, which provides a generous tolerance to over-equalization of the amplitude of the predriver output signal.

Figure 2:
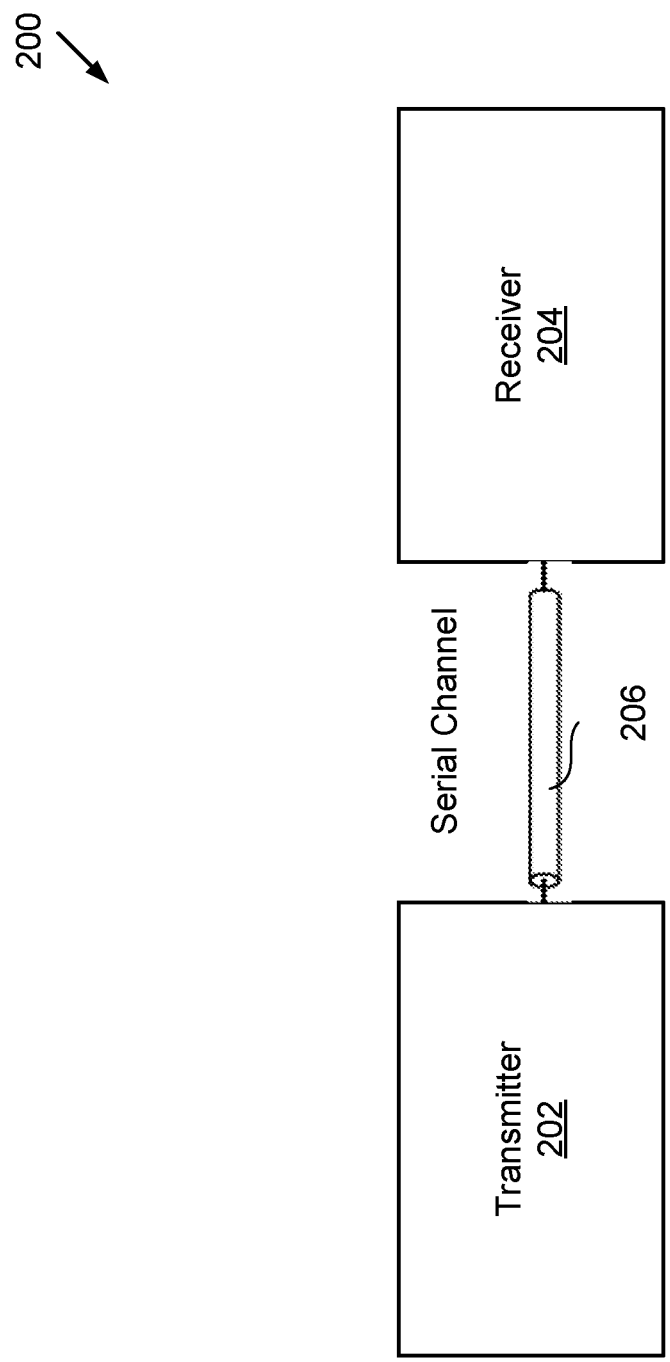
FIG. 2 is a block diagram illustrating an exemplary communication system according to some embodiments of the present disclosure.

FIG. 2 is a block diagram illustrating an exemplary communication system 200 (also referred to as a serial link 200). Communication system 200 includes a transmitter 202 and a receiver 204. The receiver 204 may be coupled to the transmitter 202 via communication channel 206. In the illustrated example of FIG. 2, the communication channel 206 is a serial channel, and may include a transmission line including, for example, traces on a printed circuit board (PCB), impedance-controlled cables (e.g., coaxial cables, shield twisted pair (STP) cables), fiber optic modules, and/or any other suitable transmission line for a communication channel.

Figure 3:
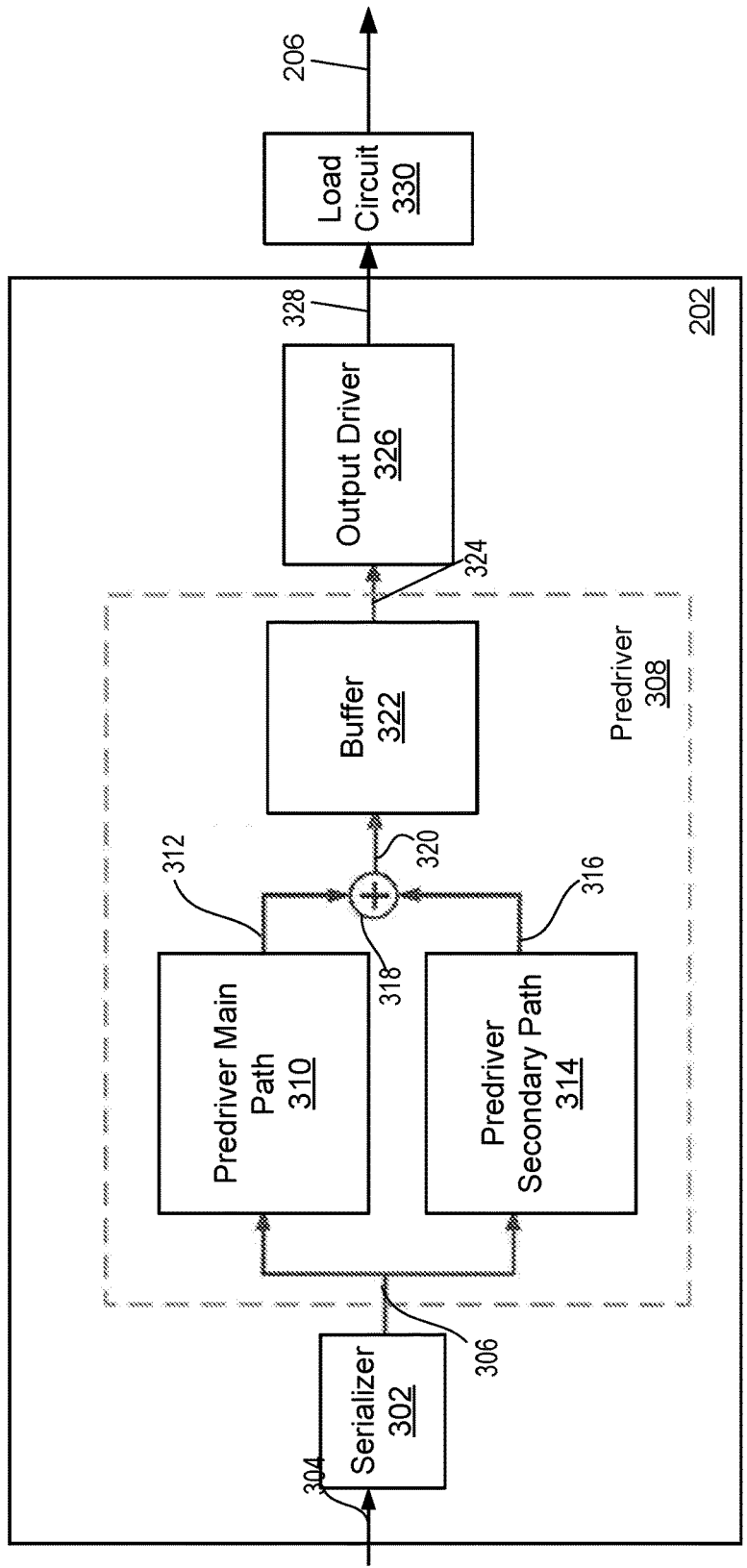
FIG. 3 is a block diagram illustrating an exemplary transmitter according to some embodiments of the present disclosure.

Referring to FIG. 3, illustrated therein is an exemplary transmitter 202 of a communication system 200. The transmitter 202 includes a serializer 302, a predriver 308, and an output driver 326. The serializer 302 receives a signal 304 including parallel bits of data, and serialize the parallel input data to generate a serial signal 306.

In the illustrated example of FIG. 3, the predriver 308 receives the serial signal 306, and generates an equalized predriver output signal 324 by using a predriver main path 310 and a predriver secondary path 314. As such, the serial signal 306 is also referred to as a predriver input signal 306. The predriver main path 310 has a first driving strength and a first delay, and generates a predriver main path output signal 312 having a first delay relative to the serial signal 306. In an example, the first driving strength of the predriver main path 310 is configured to drive the output driver 326. The predriver secondary path 314 has a second driving strength different from the first driving strength, and a second delay different from the first delay. In the example of FIG. 3, the second delay of the predriver secondary path 314 is greater than the first delay. In other words, the predriver secondary path 314 has a delay Δt relative to the predriver main path output signal 312. Such a predriver secondary path 314 may also be referred to as a predriver post-cursor path 314. The predriver post-cursor path 314 receives the serial signal 306 from the serializer 302, and outputs a predriver post-cursor path output signal 316. The predriver post-cursor path output signal 316 is inverted from the predriver main path output signal 312 with a delay Δt relative to the predriver main path output signal 312. In other words, the predriver post-cursor path output signal 316 has a polarity that is opposite to the polarity of the predriver main path output signal 312. In some examples, the predriver post-cursor path 314 has a driving strength less than the predriver main path 310 (e.g., by at least about 70%). Further, the predriver post-cursor path 314 may consume power much less than the predriver main path 310 (e.g., by at least about 70%). In various embodiments, the predriver main path 310 and the predriver post-cursor path 314 use the same circuit implementation technology. For example, the predriver main path 310 and the predriver post-cursor path 314 are both implemented using CMOS. In another example, the predriver main path 310 and the predriver post-cursor path 314 are both implemented using current mode logic (CML). By using the same circuit implementation technology, the predriver main path 310 and the predriver post-cursor path 314 track each other in the fabrication process, voltage, and temperature (PVT) of the fabrication process of the transmitter. As such, the equalization sensitivity to the PVT variation is limited.

It is noted that while a predriver post-cursor path is used as an example of the predriver secondary path 314, the predriver secondary path 314 may include alternative or additional paths having different delays relative to the predriver main path 310. Those delays relative to the predriver main path 310 are greater than the rise/fall time but less than the UI. In another example, the predriver secondary path 314 includes a particular path that has a delay less than the delay of the predriver main path 310, and the difference $\Delta t$ in the delays of the predriver main path 310 and that particular path is greater than the rise/fall time but less than the UI. That particular path may be referred to as a predriver pre-cursor path. The predriver main path output signal 312 has a delay $\Delta t$ relative to the output signal of the predriver pre-cursor path. Unlike the output signal of a predriver post-cursor path, the output signal of the predriver pre-cursor path is not inverted from the predriver main path output signal 312.

In the illustrated example of FIG. 3, the predriver main path output signal 312 and the predriver post-cursor path output signal 316 are sent to a summing node 318, which combines (e.g., current sums) the predriver main path output signal 312 and the predriver post-cursor path output signal 316 to generate a summing node output signal 320. The summing node output signal 320 is sent to a buffer 322, which may invert and/or buffer the summing node output signal 320 to generate a predriver output signal 324. The buffer 322 performs the inversion and/or buffering, such that the amplitude of the buffered signal 324 sent to the output driver 326 has a full rail-to-rail swing.

In the illustrated example of FIG. 3, an output driver 326 receives the predriver output signal 324, and outputs an output driver output signal 328. The output driver 326 provides a driving strength that is big enough to drive the load circuit 330 and the transmission line of the communication channel 206. The load circuit 330 may include electrostatic discharge (ESD) protection circuits. The output driver 326 may include a current-mode driver (e.g., a push-pull current-mode driver, a CML driver) or a voltage-mode driver (e.g., a CMOS voltage-model driver).

Figure 4A:
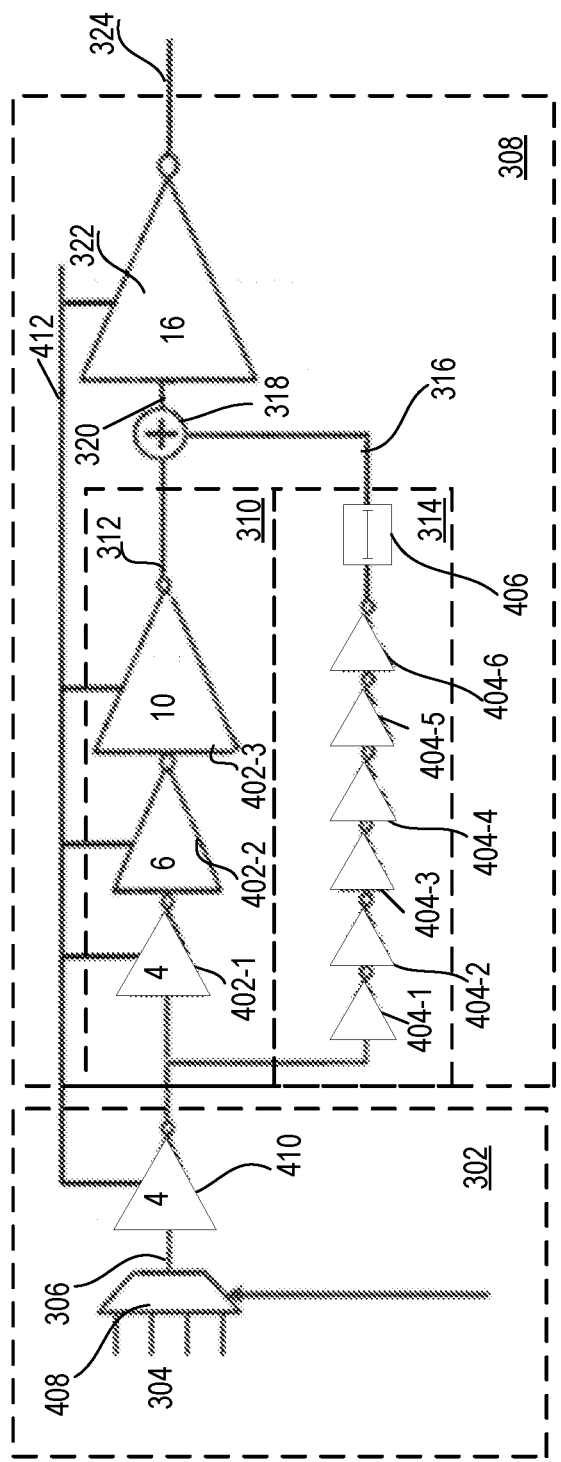
FIG. 4A is a block diagram illustrating an exemplary predriver according to some embodiments of the present disclosure.
Figure 4B:
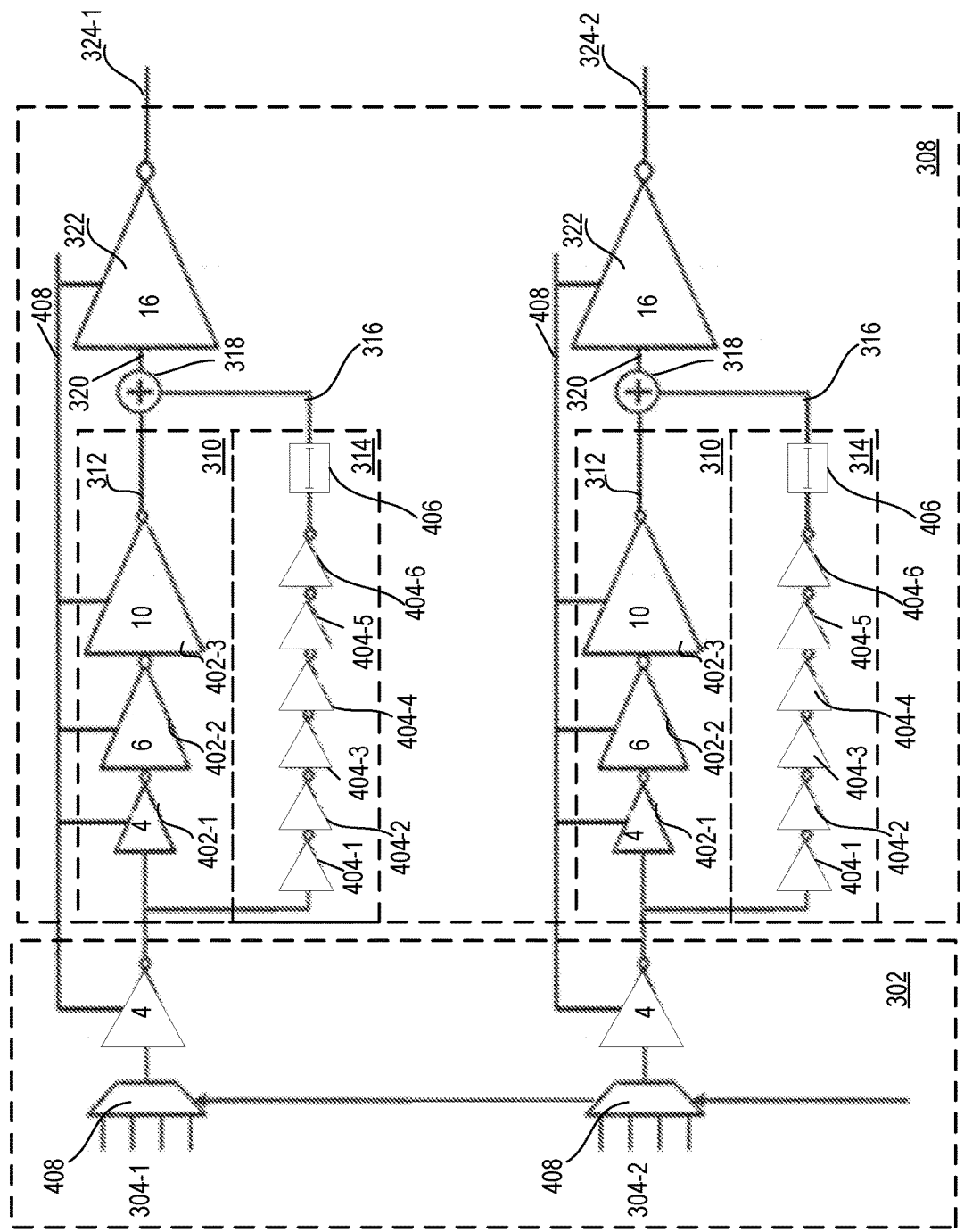
FIG. 4B is a block diagram illustrating an exemplary predriver according to some embodiments of the present disclosure.

Referring to FIGS. 4A and 4B, examples of the predriver 308 implementing predriver equalization are illustrated. Referring to FIG. 4A, a predriver 308 is coupled to a serializer 302, and both the serializer 302 and the predriver 308 are connected to a power supply 412. The serializer 302 includes a multiplexer 408, which receives a parallel signal 304 and generates a serial signal 306. The serial signal 306 is sent to an inverter 410, which sends a buffered signal to the predriver 308.

In the example of FIG. 4A, the predriver 308 includes a predriver main path 310 and a predriver post-cursor path 314. The predriver main path 310 includes a three-stage tapered buffer chain. The three stages of the tapered buffer chain correspond to inverters 402-1, 402-2, and 402-3 respectively. Each inverter from inverters 402-1 through 402-3 is sequentially sized larger (e.g., from smallest to largest). The tapered sizing of the inverters 402-1 through 402-3 sequentially increases the driving strength of the digital signal propagating through inverters 402-1 through 402-3. In an example, the inverters 402-1, 402-2, and 402-3 have driving strengths 4 milliamps (mA), 6 mA, and 10 mA respectively. In various embodiments, the size of an inverter may be determined based on the dimensions (e.g., widths) of the transistors of the inverter. For example, the size of the inverter is the sum of widths of the transistors of the inverter. A driving strength of an inverter may be proportional to the inverter size, and inversely proportional to an effective resistance of the inverter. As such, a desired driving strength of the inverter may be achieved by adjusting the size the inverter. In various embodiments, the ratio of an inverter size to the size of the preceding inverter in the tapered buffer chain is referred to as a tapering factor or a stage ratio. In the example of FIG. 4A, the tapering factors of the second and third stages of the tapered buffer chain of the predriver main path 310 are 1.5 and 1.67 respectively. The first inverter 402-1 in the tapered buffer chain has a driving strength (e.g., 4 mA) that is the same as the driving strength (e.g., 4 mA) of the inverter 410 of the serializer 302. The predriver main path 310 may be the same as the driving strength of the last inverter 402-3 (e.g., 10 mA).

In the example of FIG. 4A, the predriver 308 includes a predriver post-cursor path 314, which includes a six-stage tapered buffer chain and a delay line 406. The six stages of the tapered buffer chain correspond to inverters 404-1, 404-2, 404-3, 404-4, 404-5, and 404-6 respectively. Each inverter from inverters 404-1 through 404-6 has a size equal to or greater than that of the previous inverter in the chain, and accordingly, has a driving strength equal to or greater than that of the previous inverter in the tapered buffer chain. In the example of FIG. 4A, the inverters 404-1, 404-2, 404-3, 404-4, 404-5, and 404-6 have driving strengths 2 mA, 2 mA, 3 mA, 3 mA, 4 mA, and 4 mA respectively. As such, the tapering factors of the second through sixth stages of the tapered buffer chain are 1, 1.5, 1, 1.33, and 1 respectively. The first inverter 404-1 in the tapered buffer chain has a driving strength (e.g., 2 mA) that is less than the driving strength (e.g., 4 mA) of the inverter 410. The predriver post-cursor path 314 has a driving strength equal to 4 mA, which is the same as the driving strength of the last inverter 404-6 in the tapered buffer chain.

In some embodiments, the predriver post-cursor path 314 may generate the predriver post-cursor path output signal 316 that is inverted from the predriver main path output signal 312. In other words, the predriver post-cursor path output signal 316 has a polarity opposite to that of the predriver main path output signal 312. Such opposite polarities may be achieved by using stage numbers having different parities in the tapered buffer chains in the predriver post-cursor path 314 and the predriver post-cursor path output signal 316. In an example, the predriver main path 310 has an odd stage number (e.g., three), and the predriver post-cursor path 314 has an even stage number (e.g., six). In another example, the predriver main path 310 has an even stage number (e.g., four), and the predriver post-cursor path 314 has an odd stage number (e.g., seven).

In various embodiments, a driving strength ratio k is defined as the ratio between the driving strength of the predriver post-cursor path 314 and that of the predriver post-cursor path output signal 316. In some embodiments, the driving strength ratio k has a desired range (e.g., between about 0.1 and 0.5). The driving strengths of the predriver post-cursor path 314 and that of the predriver post-cursor path output signal 316 may be configured (e.g., by sizing the inverters in the predriver post-cursor path 314 and the predriver post-cursor path output signal 316) to achieve the desired range of the driving strength ratio k. In various embodiments, by allowing the driving strength ratio k to have a value within a predetermined range, more flexibility in the design of the predriver 308 is provided.

In some embodiments, a delay Δt between the predriver post-cursor path output signal 316 and the predriver main path output signal 312 has a desired range (e.g., greater than a rise/fall time of the serial signal 306 and less than one UI). The delays of the predriver main path 310 and the predriver post-cursor path 314 may be configured (e.g., by adjusting the sizes of the inverters and the stage numbers in the tapered buffer chains, or by using delay lines) to achieve the desired delay Δt. In an example, to increase the delay of the predriver post-cursor path 314, one or more inverters may be added in the tapered buffer chain of the predriver post-cursor path 314. In that example, to maintain the driving strength of the predriver post-cursor path 314, an inserted inverter may have a driving strength that is the same as the preceding inverter in the tapered buffer chain. In some embodiments, the predriver post-cursor path 314 may use one or more delay lines to achieve the desired delay Δt. In the example of FIG. 4A, the predriver post-cursor path 314 includes a delay line 406 for adjusting the delay of the predriver post-cursor path 314. Alternatively, in some embodiments, the predriver post-cursor path 314 does not include the delay line 406. In various embodiments, by allowing the delay Δt to have a value within a predetermined range, more flexibility in the design of the predriver 308 is provided. Further, such a desired range of the delay Δt may be easily achievable across PVT corners.

In the example of FIG. 4A, the predriver main path output signal 312 and the predriver post-cursor path output signal 316 are sent to a summing node 318, which generates a summing node output signal 320. The summing node output signal 320 is equalized by de-emphasis using the predriver post-cursor path 314, and is also referred to as a predriver deemphasized signal 320. The predriver deemphasized signal 320 is sent to the buffer 322 to generate the predriver output signal 324.

Referring to FIG. 4B, an example of a predriver 308 implementing differential signaling is illustrated. As shown in the example of FIG. 4B, the serializer 302 receives complementary parallel signals 304-1 and 304-2, and sends complementary serial signals to the predriver 308. The predriver 308 processes each of the received serial signals substantially similar to the predriver 308 of FIG. 4A, and generates complementary predriver output signals 324-1 and 324-2.

Referring to FIG. 5, illustrated is an exemplary timing diagram for the predriver 308. The timing diagram includes waveforms 502, 504, and 506 corresponding to the summing node output signal 320, the predriver main path output signal 312, and the predriver post-cursor path output signal 316 respectively. The waveform 504 illustrates a predriver main path output signal 312 having a pattern of "1101001011 101 . . ." and amplitude 512. The predriver main path output signal 312 signal has a UI 508 and a rise/fall time 510. The waveform 506 illustrates the predriver post-cursor path output signal 316, which is an inverted delayed signal relative to the predriver main path output signal 312 and has amplitude 514. In the illustrated example, the predriver post-cursor path output 316 has a delay Δt relative to the predriver main path output signal 312. The delay Δt is greater than the rise/fall time 510, but less than the UI 508. The ratio between the amplitudes 514 and 512 may correspond to the driving strength ratio k between the predriver post-cursor path 314 and the predriver main path 310.

In the example of FIG. 5, waveform 502 corresponds to the summing node output signal 320 that combines the predriver main path output signal 312 and the predriver post-cursor path output signal 316, which compensates for the ISI in the predriver main path output signal 312 by de-emphasis. The waveform 502 shows de-emphasis 516. In some examples, the value of the de-emphasis 516 may be determined by the driving strength ratio k. For another example, a driving strength ratio k having a value of about 0.1 corresponds to a de-emphasis value of about 1 dB. For further example, a driving strength ratio k having a value of about 0.3 corresponds to a de-emphasis value of about 3 dB.

Figure 6:
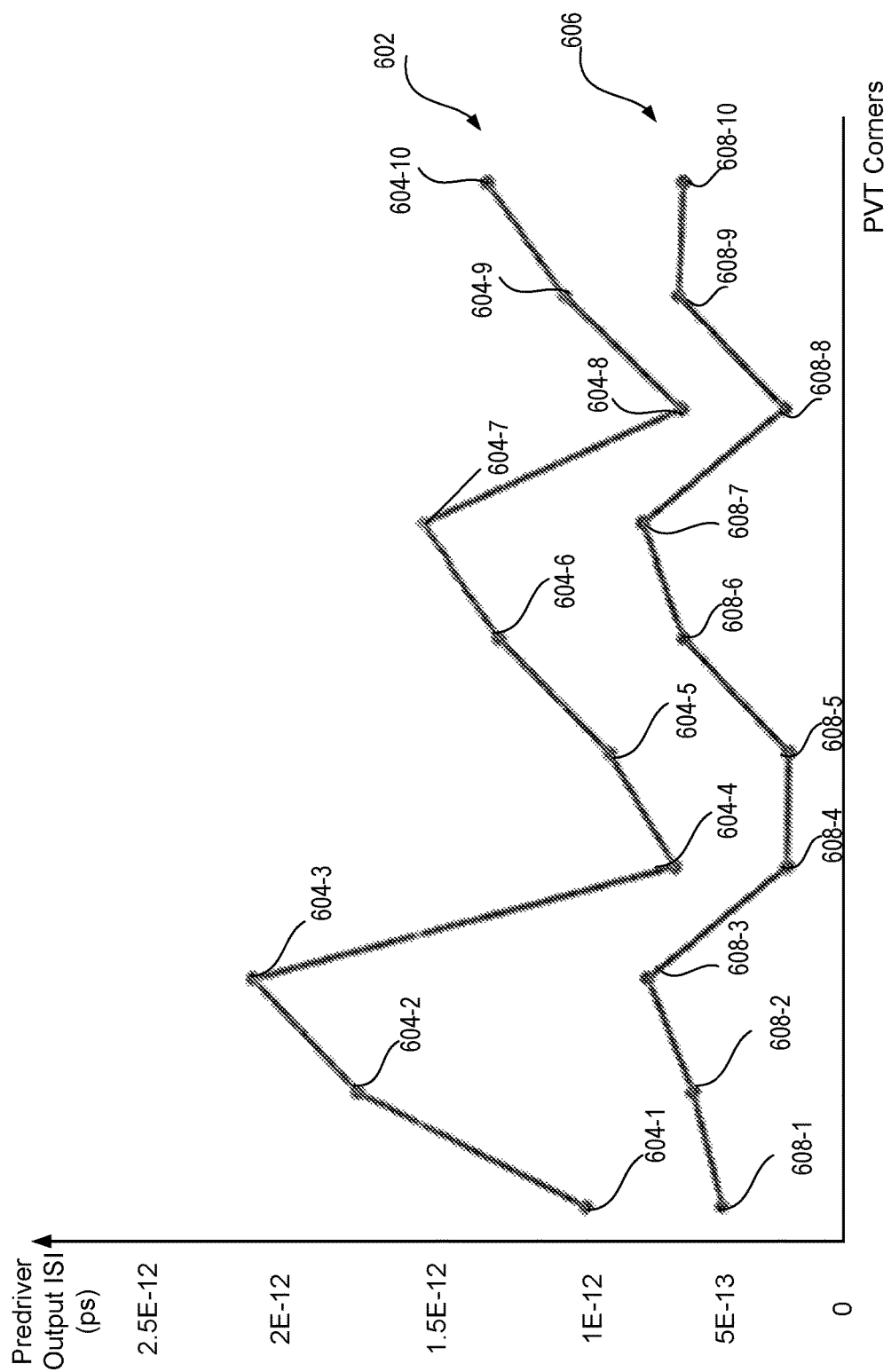
FIG. 6 illustrates performance comparison between various embodiments according to the present disclosure.

Referring to FIG. 6, illustrated is performance comparison between a first predriver without implementing equalization (e.g., a predriver 308 of FIG. 4A without the predriver post-cursor path 314) and a second predriver (e.g., a predriver 308 of FIG. 3) implementing equalization. Curve 602 illustrates an ISI curve for an output signal of the first predriver under various PVT corners. Specifically, points 604-1 through 604-10 of the curve 602 correspond to the ISI of the output signal of the first predriver under ten different PVT corners respectively. Curve 604 illustrates an ISI curve for the output signal of the second predriver (e.g., the predriver output signal 324 of the predriver 308 of FIG. 4A) under various PVT corners. Specifically, points 608-1 through 608-10 of the curve 604 correspond to the same PVT corners of points 604-1 through 604-10 respectively. As shown in curves 602 and 606, by implementing equalization in the predriver (e.g., by using a predriver post-cursor path 314), the ISI in the predriver output signal is significantly reduced across all PVT corners.

Figure 7:
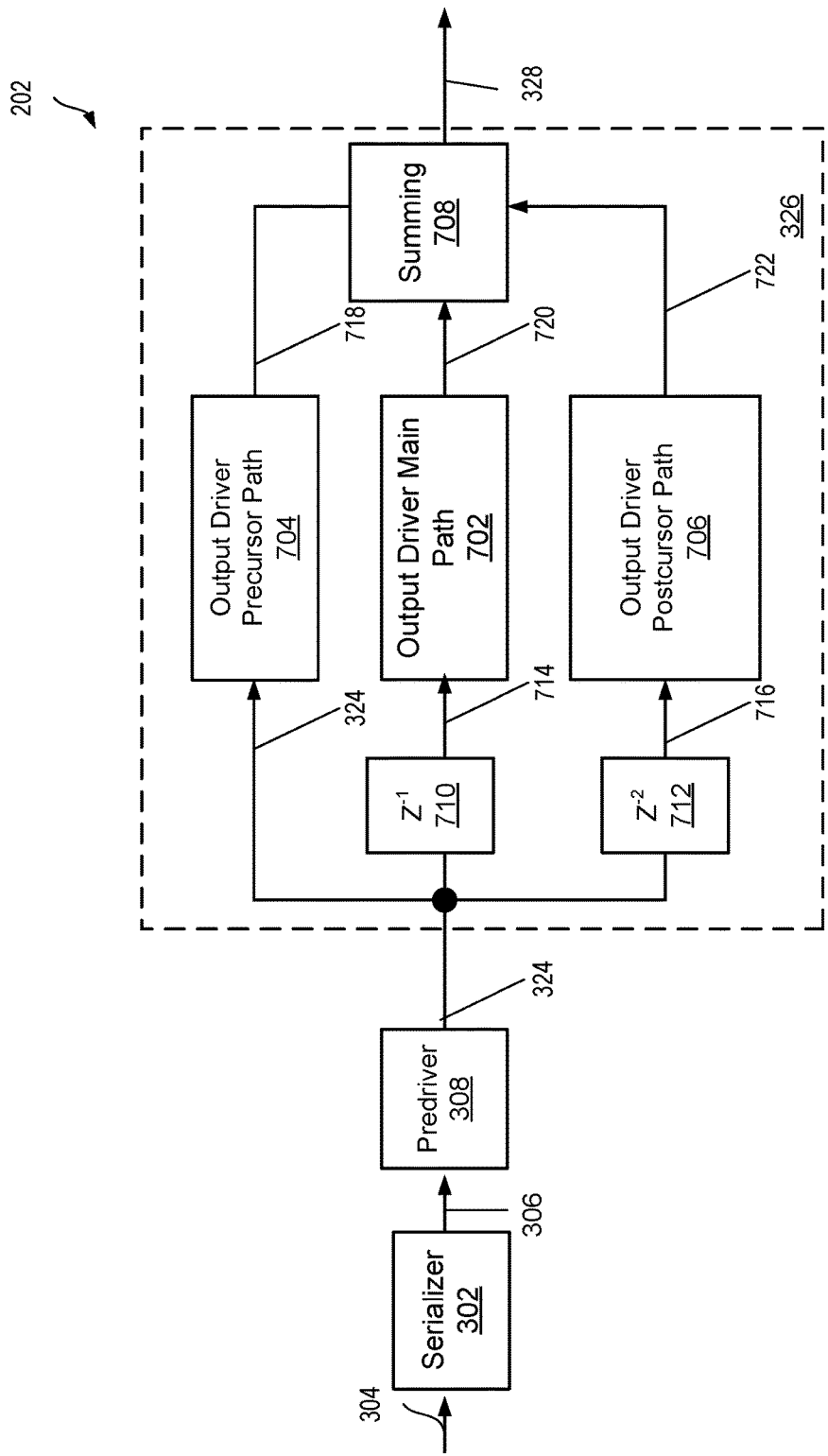
FIG. 7 is a block diagram illustrating an exemplary transmitter according to some embodiments of the present disclosure.
Figure 8:
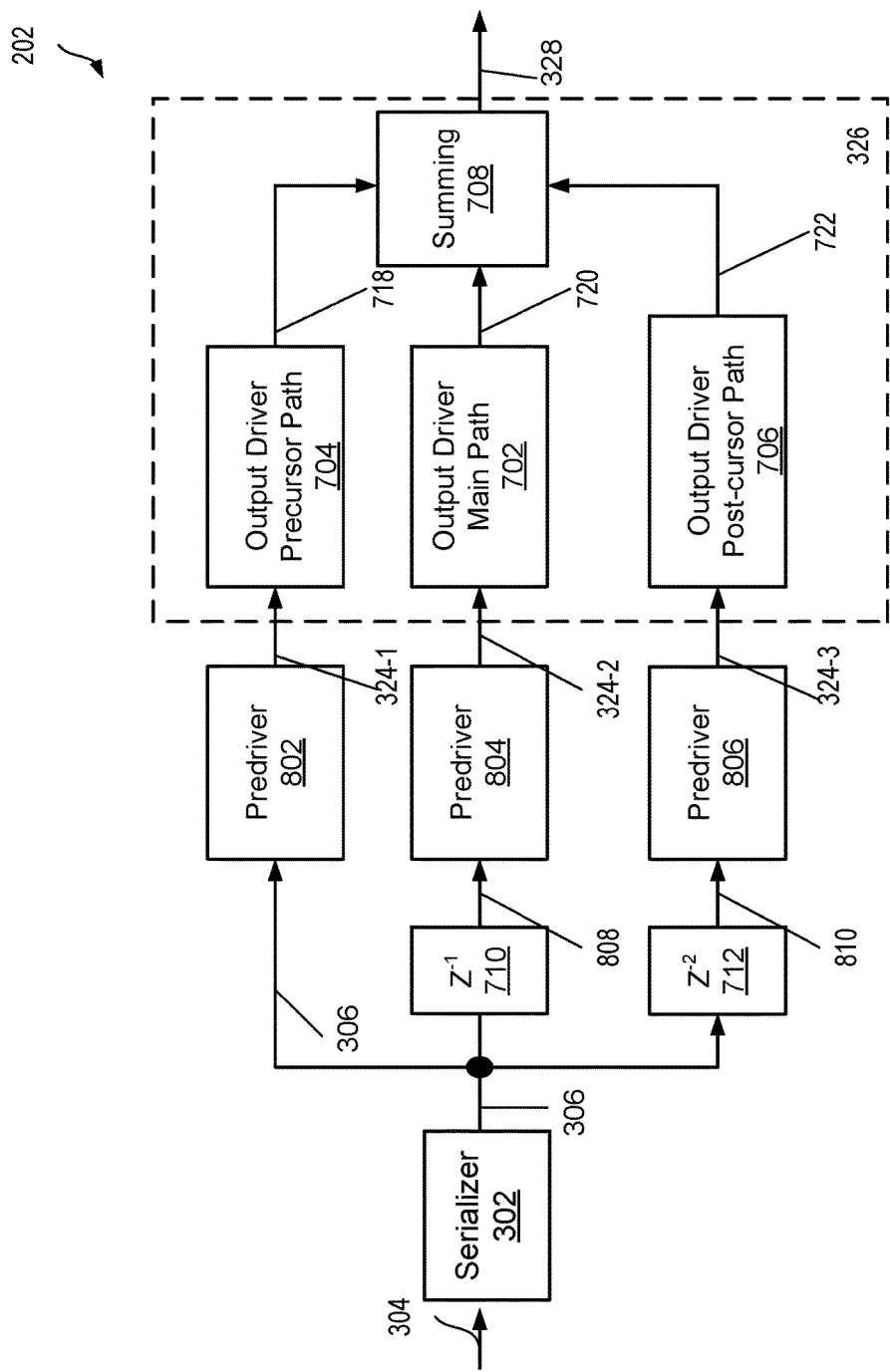
FIG. 8 is a block diagram illustrating an exemplary transmitter according to some embodiments of the present disclosure.

Referring to FIGS. 7 and 8, in various embodiments, in addition to predriver equalization, the output driver 326 may perform an output driver equalization process to compensate (pre-compensate) for channel loss, thereby reducing channel induced data dependent jitter. At the output driver 326, the signal to be transmitted through the channel is delayed by one or more UIs or a fraction of a UI. These delayed signals are then summed together with different weights at the output driver 326. This technique may be referred to as finite impulse response (FIR) or feed forward equalization (FFE). Such equalization in the output driver 326 may amplify the high-frequency component of the data stream to compensate for the frequency-dependent channel loss and thereby reducing the corresponding jitter.

In various embodiments, the equalization in the output driver 326 may be configured based on channel conditions, and the equalization tap weights may be determined and/or adjusted based on the channel conditions. Furthermore, the output driver equalization may equalize the amplitude of the output signal of the output driver 326. As such, the output driver equalization is configured to avoid over-equalization of the amplitude of the of the output driver output signal.

Referring to FIG. 7, illustrated is an example of a transmitter 202 implementing both predriver equalization and output driver equalization. In the example of FIG. 7, the predriver 308 may be substantially similar to the predriver 308 described above with reference to FIGS. 3, 4A, and 4B, and provide a predriver output signal 324 to the output driver 326. The output driver 326 uses a three-tap FIR filter to perform output driver equalization. Specifically, the output driver 326 includes three paths corresponding to an output driver main path 702, an output driver precursor path 704 (also referred to as an output driver pre-tap path 704), and an output driver post-cursor path 706 (also referred to as an output driver post-tap path 706) respectively. In the first path, the predriver output signal 324 is sent to the output driver precursor path 704. In the second path, the predriver output signal 324 is sent to a delay unit 710. The delay unit 710 delays the predriver output signal 324 by one UI, and sends its output signal 714 to the output driver main path 702. In the third path, the predriver output signal 324 is sent to a delay unit 712. The delay unit 712 delays the predriver output signal 324 by two UIs, and sends its output signal 716 to the output driver post-cursor path 706. The tap weights of the output driver precursor path 704 and the output driver post-cursor path 706 may be determined and/or adjusted based on the channel conditions.

In various embodiments, each of the output driver main path 702, the output driver precursor path 704, and the output driver post-cursor path 706 may include a current-mode driver (e.g., a push-pull current-mode driver, a current-mode logic (CML) driver) or a voltage-mode driver (e.g., a CMOS voltage-model driver). The tap weights of the output driver precursor path 704 and the output driver post-cursor path 706 may be adjusted according to channel conditions to compensate for the channel loss.

In the illustrated example, the signals 718, 720, and 722 provided by the output driver precursor path 704, the output driver main path 702, and the output driver post-cursor path 706 respectively are sent to a summing node 708, which combines signals 718, 720, and 722 to generate the output driver output signal 328. As such, the output driver output signal 328 is pre-emphasized based on the channel characteristics to compensate for channel loss.

It is noted that while a three-tap FIR filter is used in FIG. 7 as an example for output driver equalization, various equalization techniques (e.g., FFE, feedback equalization, FIR filters with different taps) may be used in output driver equalization.

Referring to FIG. 8, illustrated is an example of a transmitter 202 implementing both predriver equalization and output driver equalization. The transmitter 202 of FIG. 8 is substantially similar to the transmitter 202 of FIG. 7 other than the differences described below. In the example of FIG. 8, the output driver 326 performs equalization using the output driver precursor path 704, the output driver main path 702, and the output driver post-cursor path 706, each is driven by a corresponding predriver. Specifically, the transmitter 202 includes three paths corresponding to the output driver precursor path 704, the output driver main path 702, and the output driver post-cursor path 706 respectively. In a first path, the serial signal 306 is sent to a predriver 802, which generates a predriver output signal 324-1 and drives the output driver precursor path 704. In a second path, the serial signal 306 is sent to a delay unit 710, which delays the serial signal 306 with a delay period of one UI, and sends its output signal 808 to a predriver 804. The predriver 804 generates a predriver output signal 324-2 and drives the output driver main path 702. In a third path, the serial signal 306 is sent to a delay unit 712, which delays the serial signal 306 with a delay period of two UIs, and send its output signal 810 to a predriver 806. The predriver 806 generates a predriver output signal 324-3 and drives the output driver post-cursor path 706. The output signals 718, 720, and 722 generated by the output driver precursor path 704, the output driver main path 702, and the output driver post-cursor path 706 are combined by the summing node 708 to generate the output driver output signal 328. In an example, each of the predrivers 802, 804, and 806 implements de-emphasis equalization substantially similarly to the predriver 308 of FIG. 3.

In some embodiments, some of the predrivers 802, 804, and 806 may not implement de-emphasis equalization, which may be determined based on the predriver induced jitter of the particular predriver. In an example, the predriver 802 and 806 for the output driver secondary paths (e.g., the output driver precursor path 704 and the output driver post-cursor path 706) may induce jitter substantially less than the jitter induced by the predriver 804. As such, the predrivers 802 and 806 may not implement de-emphasis equation (e.g., by not including a predriver secondary path 314). On the other hand, the predriver 804 for the output driver main path 702 implements de-emphasis equation substantially similarly to the predriver 308 of FIG. 3.

Figure 9:
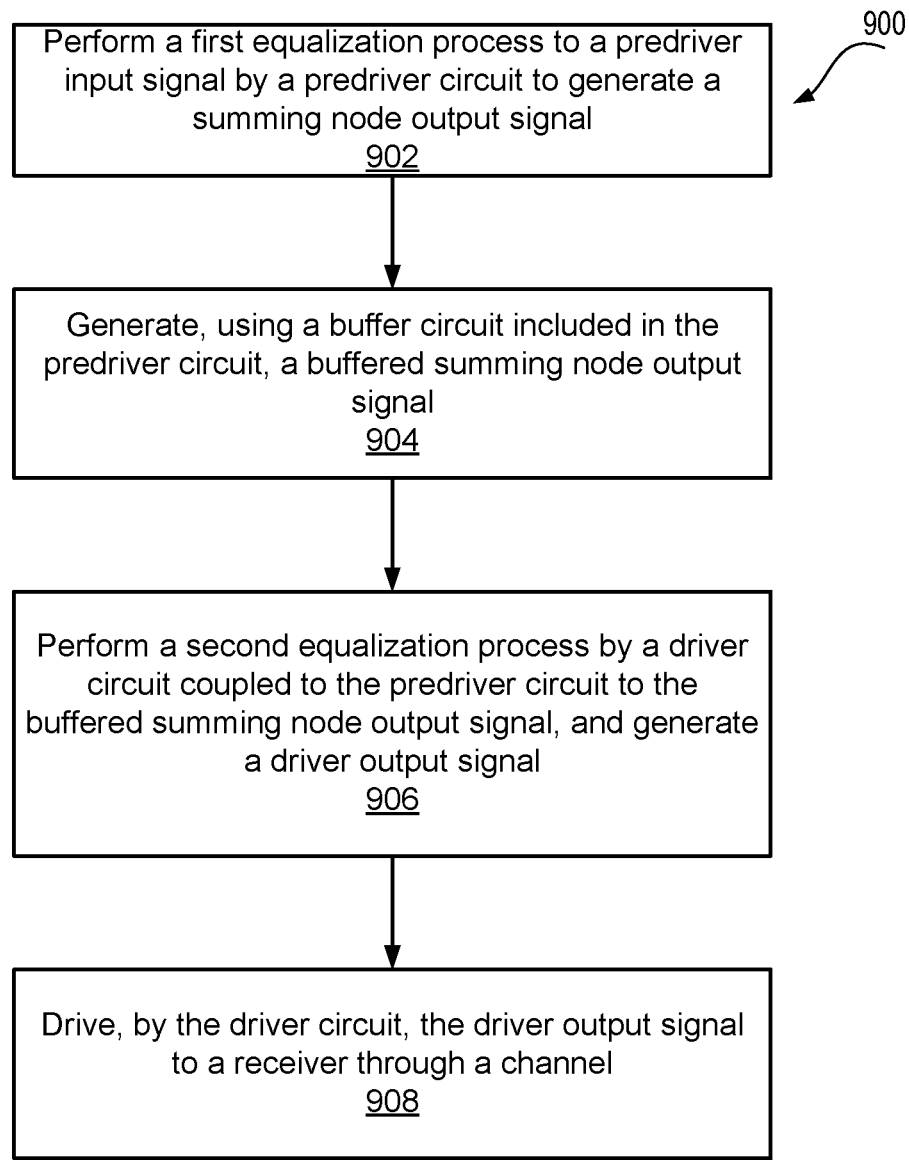
FIG. 9 is a flow diagram illustrating an exemplary method for transmitting a signal according to some embodiments of the present disclosure.

Referring to FIG. 9, an exemplary method 900 for transmitting a signal is illustrated. The method 900 begins at block 902, where a predriver circuit in a transmitter performs a first equalization process to a predriver input signal. For example, a predriver circuit 308 of a transmitter 202 may perform a first equalization process to a predriver input signal 306, and generate a summing node output signal 320. At block 904, a buffered summing node signal 324 is generated using a buffer circuit 322 of the predriver circuit 308 based on the summing node output signal 320. The method 900 may then proceed to block 906, where an output driver circuit 326 coupled to the predriver circuit 308 performs a second equalization process to the buffered summing node output signal 324, and generates a driver output signal 328. At block 908, the output driver circuit 326 drives the driver output signal 328 to a receiver 204 through a channel 206.

Figure 10:
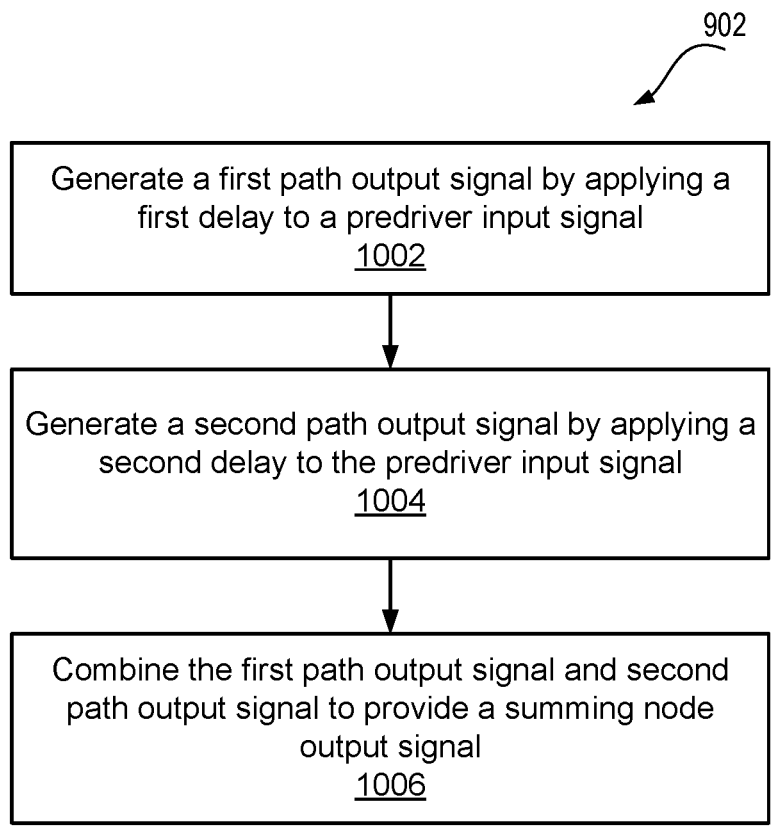
FIG. 10 is another flow diagram illustrating an exemplary method for transmitting a signal according to some embodiments of the present disclosure.

Referring to FIG. 10, an exemplary first equalization process performed at block 902 is illustrated. The first equalization process begins at block 1002, where a first path output signal 312 is generated by applying a first delay to a predriver input signal 306. The first equalization process may then proceeds to block 1004, where a second path output signal 316 is generated by applying a second delay to the predriver input signal 306. In some embodiments, the second path output signal 316 has an amplitude less than the amplitude of the first path output signal 312. The first equalization process may then proceed to block 1006, where the first path output signal 312 and second path output signal 316 are combined to provide a summing node output signal 326.

It is noted that various configurations (e.g., the driving strength ratio k, the delay Δt, sizes and driving strengths of the inverters 402-1 through 402-3 and 404-2 through 404-6) illustrated in FIGS. 2, 3, 4A, 4B, 5, 6, 7, 8, 9, and 10 are exemplary only and not intended to be limiting beyond what is specifically recited in the claims that follow. It will be understood by those skilled in that art that other configurations may be used.

Various advantages may be present in various applications of the present disclosure. No particular advantage is required for all embodiments, and different embodiments may offer different advantages. One of the advantages of some embodiments is that by performing an equalization process in the predriver, jitter in the predriver output signal is reduced. Such reduction in the predriver induced jitter may allow a tapered buffer chain in the predriver to use fewer stages having higher fan-out ratios, thereby providing savings in power and reduction in power supply induced jitter. Another advantage of some embodiments is that the equalization process in the predriver may be performed by using a predriver main path with a first driving strength and a first delay and a predriver secondary path with a second driving strength and a second delay. By allowing the second driving strength and the second delay to have values within certain ranges relative to those of the predriver main path, more flexibility in the predriver design is achieved. Yet another advantage is that the de-emphasis equalization in the predriver may be implemented by various IC technologies including, for example, CMOS and CML.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A transmitter, comprising:
    a predriver circuit configured to perform a first equalization process, the predriver circuit including:
        a first path configured to generate a first path output signal by applying a first delay to a predriver input signal, the first path having a first driving strength;
        a second path configured to generate a second path output signal by applying a second delay to the predriver input signal, the second path having a second driving strength less than the first driving strength; and
        a first summing node configured to combine the first path output signal and the second path output signal to provide a summing node output signal; and
    a driver circuit coupled to the predriver circuit and configured to generate a driver output signal based on the summing node output signal and drive the driver output signal to a receiver through a channel.

2. The transmitter of claim 1, wherein the driver circuit is configured to perform a second equalization process based on conditions of the channel.

3. The transmitter of claim 2, wherein the driver circuit includes:
    a finite impulse response (FIR) filter configured to perform the second equalization process.

4. The transmitter of claim 1, wherein the first path output signal has a first polarity opposite to a second polarity of the second path output signal.

5. The transmitter of claim 1, wherein the first path includes a first tapered buffer chain including a first number of inverters connected in series, and
    wherein the second path includes a second tapered buffer chain including a second number of inverters connected in series.

6. The transmitter of claim 5, wherein the first number has a first parity different from a second parity of the second number.

7. The transmitter of claim 6, wherein the first number is less than the second number.

8. The transmitter of claim 1, wherein a difference between the first delay and the second delay is less than a unit interval of the predriver input signal and greater than a rise time of the predriver input signal.

9. The transmitter of claim 1, wherein the predriver circuit further comprises:
    a buffer circuit coupled to the first summing node and configured to generate a buffered summing node output signal based on the summing node output signal; and
    wherein the driver circuit is configured to receive the buffered summing node output signal and generate the driver output signal based on the buffered summing node output signal.

10. The transmitter of claim 9, wherein the buffer circuit includes:
    a limiting amplifier configured to generate the buffered summing node output signal, wherein the buffered summing node output signal has a rail-to-rail amplitude swing.

11. A method, comprising:
    performing, by a predriver circuit, a first equalization process, the first equalization process including:
        generating a first path output signal by applying a first delay to a predriver input signal, the first path output signal having a first amplitude;
        generating a second path output signal by applying a second delay to the predriver input signal, the second path output signal having a second amplitude less than the first amplitude; and
        combining the first path output signal and the second path output signal to provide a summing node output signal;
    generating, by a driver circuit coupled to the predriver circuit, a driver output signal based on the summing node output signal; and
    driving, by the driver circuit, the driver output signal to a receiver through a channel.

12. The method of claim 11, further comprising:
    performing, by the driver circuit, a second equalization process based on conditions of the channel.

13. The method of claim 12, further comprising:
    performing the second equalization process using a finite impulse response (FIR) filter.

14. The method of claim 11, wherein the first path output signal has a first polarity opposite to a second polarity of the second path output signal.

15. The method of claim 11, further comprising:
    generating the first path output signal using a first path, the first path including a first tapered buffer chain including a first number of inverters connected in series; and
    generating the second path output signal using a second path, the second path including a second tapered buffer chain including a second number of inverters connected in series.

16. The method of claim 15, wherein the first number has a first parity different from a second parity of the second number.

17. The method of claim 16, wherein the first number is less than the second number.

18. The method of claim 11, wherein a difference between the first delay and the second delay is less than a unit interval of the predriver input signal and greater than a rise time of the predriver input signal.

19. The method of claim 11, further comprising:
    generating, using a buffer circuit included in the predriver circuit, a buffered summing node output signal based on the summing node output signal; and
    generating, by the driver circuit, the driver output signal based on the buffered summing node output signal.

20. The method of claim 19, further comprising:
    generating, using a limiting amplifier included in the buffer circuit, the buffered summing node output signal, wherein the buffered summing node output signal has a rail-to-rail swing.

* * * * *